(12) United States Patent
Lee-Bouhours et al.

(10) Patent No.: US 8,685,771 B2
(45) Date of Patent: Apr. 1, 2014

(54) OPTIMIZED PROCESS FOR FABRICATING LIGHT-EMITTING DEVICES USING ARTIFICIAL MATERIALS

(75) Inventors: Mane-Si Laure Lee-Bouhours, Les Molières (FR); Michel Garcia, Auneau (FR); Shailendra Bansropun, Paris (FR); Brigitte Loiseaux, Bures sur Yvette (FR)

(73) Assignee: Thales, Neuilly sur Seine (FR)

( * ) Notice: Subject to any disclaimer, the term of this patent is extended or adjusted under 35 U.S.C. 154(b) by 939 days.

(21) Appl. No.: 12/666,068

(22) PCT Filed: Jun. 11, 2008

(86) PCT No.: PCT/EP2008/057254
§ 371 (c)(1),
(2), (4) Date: May 28, 2010

(87) PCT Pub. No.: WO2009/000645
PCT Pub. Date: Dec. 31, 2008

(65) Prior Publication Data
US 2010/0291717 A1 Nov. 18, 2010

(30) Foreign Application Priority Data
Jun. 22, 2007 (FR) .................... 07 04503

(51) Int. Cl.
*H01L 21/00* (2006.01)

(52) U.S. Cl.
USPC .......................................... 438/31

(58) Field of Classification Search
USPC .................. 438/9, 31, 183; 385/1, 2, 4, 19
See application file for complete search history.

(56) References Cited

U.S. PATENT DOCUMENTS

| | | | |
|---|---|---|---|
| 6,483,635 B1 | 11/2002 | Wach | |
| 7,298,940 B2 * | 11/2007 | Abu-Ageel | 385/31 |
| 2005/0153464 A1 * | 7/2005 | Fainman et al. | 438/9 |
| 2007/0103782 A1 | 5/2007 | Lee et al. | |

* cited by examiner

*Primary Examiner* — Brook Kebede
(74) *Attorney, Agent, or Firm* — LaRiviere, Grubman & Payne, LLP

(57) ABSTRACT

The present invention relates to a process for fabricating light-emitting device. More particularly, the aim of the invention is to allow the fabricating of light emitters with improved efficiency by using artificial materials, enabling antireflection or high-reflectivity treatments to be carried out. For this purpose, subwavelength structures are etched on one of the ends of an emissive cavity, enabling external face to be controlled. The invention applies to any light emitter, and therefore notably to lasers and more particularly still to QCLs (quantum cascade lasers). Moreover, the fabrication process according to the invention is preferably a wafer-scale process.

19 Claims, 6 Drawing Sheets

OPTIMIZED PROCESS FOR FABRICATING LIGHT-EMITTING DEVICES USING ARTIFICIAL MATERIALS

PRIORITY CLAIM

This application claims priority to PCT Patent Application Number PCT/EP2008/057254, entitled Method of Manufacturing Optimized Light Devices Using Artificial Materials, filed Jun. 11, 2008.

TECHNICAL FIELD

The present invention relates to a process for fabricating light-emitting devices. More precisely, the aim of the invention is to produce light emitters of improved efficiency by the use of artificial materials, said artificial materials enabling precise antireflection or high-reflectivity treatments to be carried out. Moreover, the fabrication process according to the invention has the advantage of being a wafer-scale process and of reducing the number of technological steps required.

The invention applies to any light emitter or amplifier, and therefore notably to lasers, and more particularly still to QCLs (quantum cascade lasers). The case of cascade lasers will be more particularly explained by an example of the invention.

BACKGROUND OF THE INVENTION

For the purpose of improving the efficiency of these laser sources, it is common practice to carry out the treatments on the external faces of the emissive cavities. The objective of these treatments is generally to obtain either an antireflection function, i.e. a reflectivity as close as possible to 0%, typically on the output face of the laser cavity, or a high-reflectivity function, i.e. a reflectivity as close as possible to 100%, typically on the face opposite the output face.

Currently, for the purpose of obtaining the desired effect, namely antireflection or high reflectivity, one commonly employed technology consists in depositing thin films of dielectric material on the edge of the laser after the emitting zone has been cleaved. This technology enables the efficiency of these laser sources to be very significantly improved (typically by 250%). From a theoretical standpoint, to obtain the antireflection function on a substrate having a refractive index $n_{substrate}$ for a light wave of wavelength $\lambda$, it is ideally necessary to deposit on this substrate a film of a material having a refractive index $n_{AR}$ equal to $\sqrt{n_{substrate}}$ with a thickness of $\lambda/4n_{AR}$. The reflectivity at the air/substrate interface is then theoretically 0%. However, since the number of existing materials is limited, it is very difficult and constricting to obtain a material to be deposited that has the suitable refractive index.

To get round this drawback, it is general practice to deposit multilayer coatings. However, another major drawback associated with this technology remains. It lies in the fact that it is necessary for the linear arrays of lasers to be manipulated directly after cleavage so as to deposit the coatings on each of the external faces of the cavity. Since the size of the chips does not exceed a few millimeters in width for a few millimeters in length, these treatments prove to be complicated. In addition, as regards QCLs, because of the long emission wavelengths of the latter (these sources are used in ranges that may go from the infrared range to the THz range), the thicknesses of the deposited layers rapidly reach critical values, posing problems such as mechanical integrity or induced strain problems. Consequently, the uncertain reliability of these complex treatments is currently putting off their use.

Another technology for adjusting the reflectivity of the external faces of laser cavities consists in etching, on said faces, microstructures that may be smaller than the wavelength in a direction transverse to that in which the light propagates in the cavity. These are then referred to as subwavelength structures. This technology may theoretically enable precise antireflection treatments or high-reflectivity treatments to be carried out. However, it is very difficult at the present time to produce lasers using this technology. This requires producing etched features on a subwavelength scale on cleaved laser cavities, in several stages, so as to obtain an antireflection treatment on the output face and a high-reflectivity treatment on the opposite face. Furthermore, the cleaving carried out, to singularize the laser cavities, does not enable their lengths to be guaranteed. Consequently, the fabrication processes for such lasers is at the present time complex, costly and of uncertain quality.

To summarize, the existing technologies for improving the efficiency of light emitters, such as laser sources for example, notably by means of antireflection treatments, are difficult to implement. In addition, their performance and their reliability are not guaranteed.

For the purpose of alleviating the aforementioned drawbacks, the invention provides a process for fabricating light-emitting devices of improved efficiency, which manufacturing process may be a wafer-scale process.

More precisely, the invention is based on the exploitation of artificial materials of adjustable refractive index, these artificial materials being obtained by etching subwavelength structures, as explained above. The invention makes it possible to fabricate, notably using a wafer-scale process, laser cavities the external faces of which have precise antireflection treatments or high-reflectivity treatments, resulting in the production of optimized light emitters.

SUMMARY OF THE INVENTION

For this purpose, the subject of the invention is a process for fabricating a light-emitting device comprising:
  an active zone in which a light beam having one or more wavelengths can propagate along a propagation direction; and
  at least one wall comprising structures smaller in size than the wavelength in a direction transverse to the propagation direction of the light beam, these structures, called subwavelength structures, enabling the reflectivity of said wall to be adjusted, characterized in that it comprises:
  production of a single mask; and
  etching, through said single mask, in a substrate consisting of a stack of layers of semiconductor material forming an emissive cavity, said subwavelength structures and cleavage lines defining said light-emitting device during the same etching operation.

Advantageously, the fabrication process according to the invention may be a wafer-scale process, said cleavage lines separating the various light-emitting devices from one another, said light-emitting devices being produced using said single mask, each light-emitting device having a length imposed by said single mask.

Advantageously, the wall comprising said subwavelength structures constitutes an antireflection structure providing an antireflection function, i.e. a reflectivity of less than about 10% with respect to the wavelength or wavelengths.

Advantageously, said wall constitutes an output face orthogonal to the light beam.

Advantageously, the device produced according to said process may include a second wall constituting a second antireflection structure opposite and parallel to the first antireflection structure, the combination of the two antireflection structures enabling the device to provide a semiconductor light amplifier function.

Advantageously, the device produced according to said process may include a second wall constituting a high-reflectivity structure, i.e. one having a reflectivity greater than about 90% with respect to the wavelength or wavelengths, said second wall being opposite and parallel to the wall constituting an antireflection structure.

Advantageously, the wall constituting the antireflection structure and, opposite it, the second wall constituting the high-reflectivity structure define an amplifying cavity so as to constitute a semiconductor laser.

Advantageously, the active zone of the light-emitting device is formed from an integer number of periods each consisting of a stack of epitaxially grown layers of semiconductor material such as InGaAs, AlInAs, GaAs, AlGaAs and InP, so as to constitute for example a quantum cascade laser (or QCL).

Advantageously, the high-reflectivity structure consists of an alternation of N strata having a high refractive index, i.e. greater than or equal to about 3, and of (N−1) strata having a low refractive index, i.e. equal to about 1, N being an integer equal to or greater than 1.

Advantageously, the high-reflectivity structure consists of an alternation of strata of materials having a high refractive index and air strata, all said strata having approximately equal optical thicknesses.

Advantageously, the high-reflectivity structure consists of an alternation of strata comprising etched subwavelength periodical structures enabling the effective refractive index of each of the strata, and consequently that of the high-reflectivity structure, to be fixed.

Advantageously, the fabrication process according to the invention makes it possible to produce a light-emitting device such that:
  the light beam has a wavelength of 9 µm;
  each stratum of the high-reflectivity structure has an optical thickness of about 2.2 µm; and
  the antireflection structure has a period of about 2.9 µm, a depth of about 1.3 µm, a width of about 0.5 µm and an etched height of greater than 9 µm.

Advantageously, the etching carried out in a substrate consisting of a stack of layers of semiconductor materials forming an emissive cavity is based on the use of a high plasma density (HPD) source.

Advantageously, the high plasma density source is an inductively coupled plasma (ICP).

Advantageously, the etching carried out in a substrate consisting of a stack of layers of semiconductor materials forming an emissive cavity is based on the use of reactive ion etching (RIE) technology.

BRIEF DESCRIPTION OF THE DRAWINGS

Other features and advantages of the invention will become apparent from the following description given in conjunction with the appended drawings which show.

DETAILED DESCRIPTION OF THE INVENTION

Figure 1:
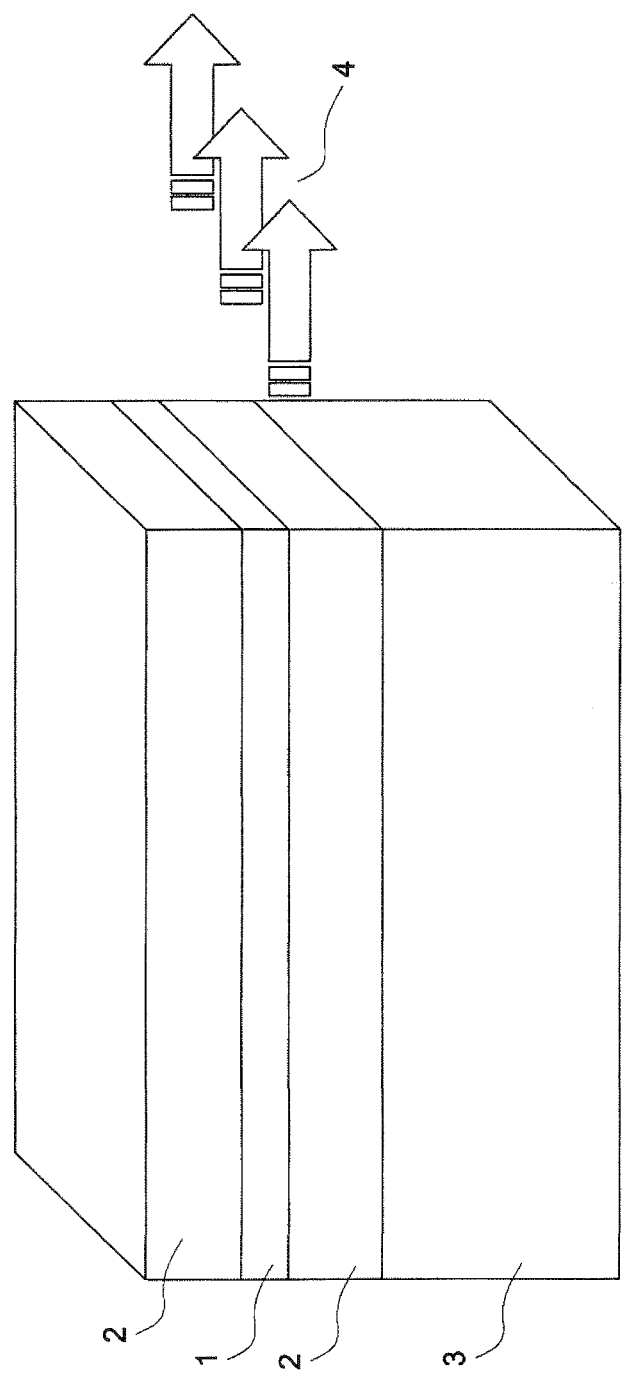
FIG. 1: a schematic illustration of a quantum cascade laser (QCL) according to the prior art.

FIG. 1 shows a simplified diagram of the operation of a quantum cascade laser according to the prior art. The cascade laser differs from conventional lasers by the specificity of its active zone 1. This is formed from a number of periods each consisting of several tens of epitaxially grown layers of semiconductor materials (such as, for example, InGaAs, AlInAs, GaAs, AlGaAs or InP).

When an electric current is injected into this active zone 1, the electrons acquire energy that they restore by the cascade effect, each time in the form of a photon. The engineering of the material (nature of the semiconductor, thickness of the epitaxially grown layers, etc.) determines the emission wavelength of the laser. The waveguides 2 enable the light output by the laser in the form of a beam 4 to be amplified. Moreover, the active zone 1 and the waveguides 2 are grown on any substrate 3 that provides the function of a mechanical support.

In general, the reflection loss at the output of the QCL laser is around 25% for an InP active zone because of the difference between the refractive index of InP, which is about 3 for a 9 µm wavelength, and the refractive index of air, which is close to 1.

Notably, to limit this loss, it is necessary to provide an antireflection treatment on the output face of the laser and to introduce a high reflectivity on the other face. For this purpose, the imperfect technologies described in the preamble (in particular, thin-film deposition) are used at the present time. The invention proposes to use what are called "artificial" materials, comprising etched subwavelength structures in order to improve the control of the antireflection and high-reflectivity functions that it is desired to introduce.

Figure 2:
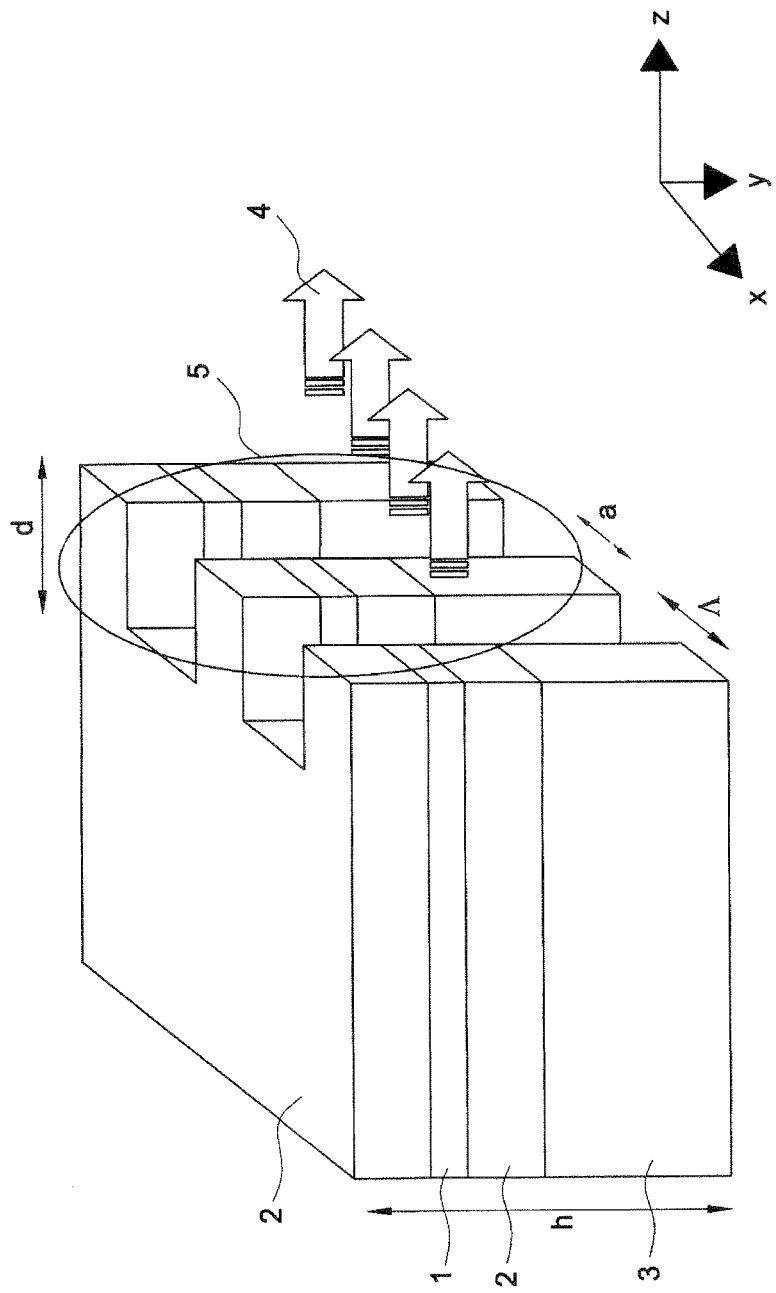
FIG. 2: a diagram of an antireflection treatment by the etching of subwavelength structures.

Thus, FIG. 2 shows a diagram of an artificial material obtained by the etching of subwavelength structures 5. As explained above, it is possible from a theoretical standpoint for any substrate of refractive index $n_{substrate}$ to undergo an antireflection treatment, so as not to reflect at the wavelength $\lambda$, by depositing on the surface thereof a thin film of a material having a refractive index $n_{AR}$ equal to $\sqrt{n_{substrate}}$ with a thickness of $\lambda/4n_{AR}$.

Now, the current ability to control microtechnologies enables subwavelength structures to be etched. These may be lines, holes, pillars or other simple geometries etched into a substrate. Effective medium theory then teaches that, simplistically, the incident light illuminating the substrate does not "perceive" the etched subwavelength structures but an artificial homogenous medium, the refractive index of which, called effective index, is between the refractive index of the constituent material of the substrate and that of air. Thus, depending on the size (width a), the geometric shape (cylinder, rectangular parallelepiped, etc.) and the period Λ of the etched subwavelength structures, it is possible to adjust the local average index of the artificial material obtained, as shown in FIG. 3.

Figure 3:
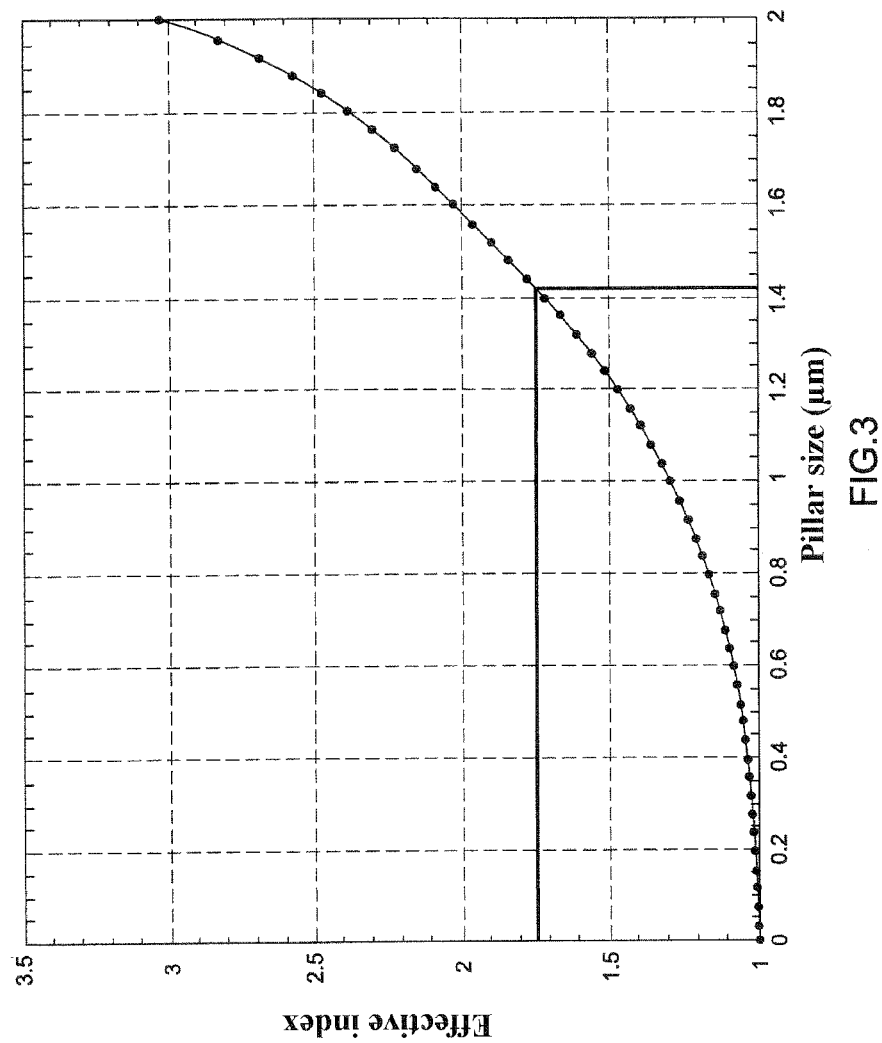
FIG. 3: a graph demonstrating the possibility of precisely adjusting the refractive index of a surface by the etching of subwavelength structures.

FIG. 3 shows the variation in the effective index of an artificial material based on an InP substrate in which microstructures with a period of 2 μm have been etched, the substrate being illuminated at normal incidence at a wavelength of 9 μm in unpolarized light. Knowing that InP has an intrinsic refractive index $n_{InP}$ of 3.037 at 9 μm, it has been found that by etching pillars with a width a of about 1.41 μm, and with a periodicity of 2 μm, it is possible to produce an artificial material with a refractive index $n_{AR}=1.74=\sqrt{n_{InP}}$. By etching these microstructures down to a depth $d=\lambda/4n_{AR}=1.29$ μm, a theoretically perfect antireflection structure is therefore obtained.

Figure 4A:
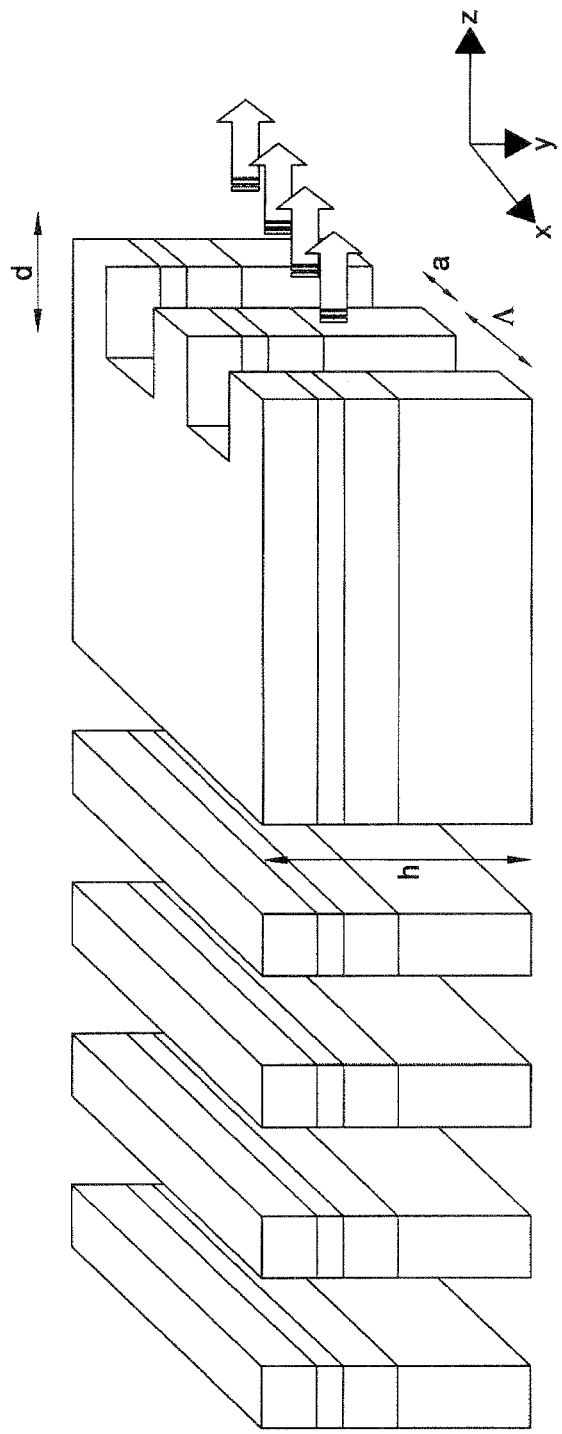
FIG. 4a: a diagram showing the association between an antireflection structure and a high-reflectivity structure in a laser, the antireflection and high-reflectivity treatments being carried out using etched subwavelength structures.

FIG. 4a shows the association between an antireflection structure AR as described in FIG. 2 and a high-reflectivity structure HR for the purpose of producing a laser, and more particularly a quantum cascade laser. The high-reflectivity structure is a Bragg mirror consisting of pairs of structures combining a high-refractive-index layer with a low-refractive-index layer. The reflectivity of the mirror HR depends on the number of pairs and on the difference in index between the various strata and on the optical thicknesses of the various strata. In the example shown in FIG. 4, the structure HR is made up of four emissive material strata separated by three air strata.

Figure 4B:
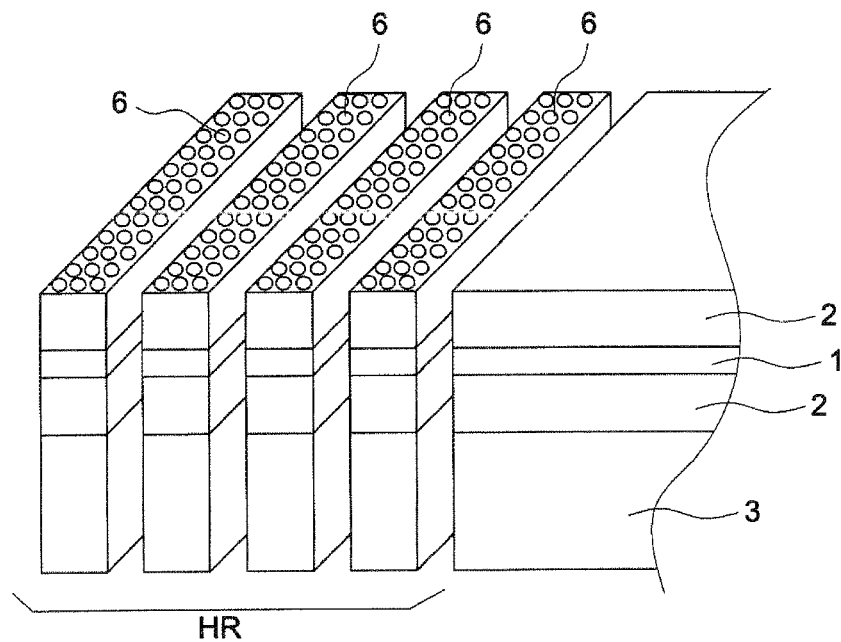
FIG. 4b: a diagram of a high-reflectivity structure consisting of an alternation of strata having subwavelength structures.

As shown in FIG. 4b, the structure may, in the absolute, be an alternation of strata of artificial materials. The principle of producing these artificial materials is then the same as in the case of the structures AR shown in FIG. 2. Different subwavelength structures 6, notably differing in terms of size and geometry, are simply etched. For example, cylindrical holes may be etched in each material strata of the structure HR. In addition, the strata may all have different thicknesses and their spacing may also vary. Thus, the refractive index of each of the strata constituting the mirror HR may be independently controlled. As a consequence, the emission wavelength of the laser is controlled.

Figure 4C:
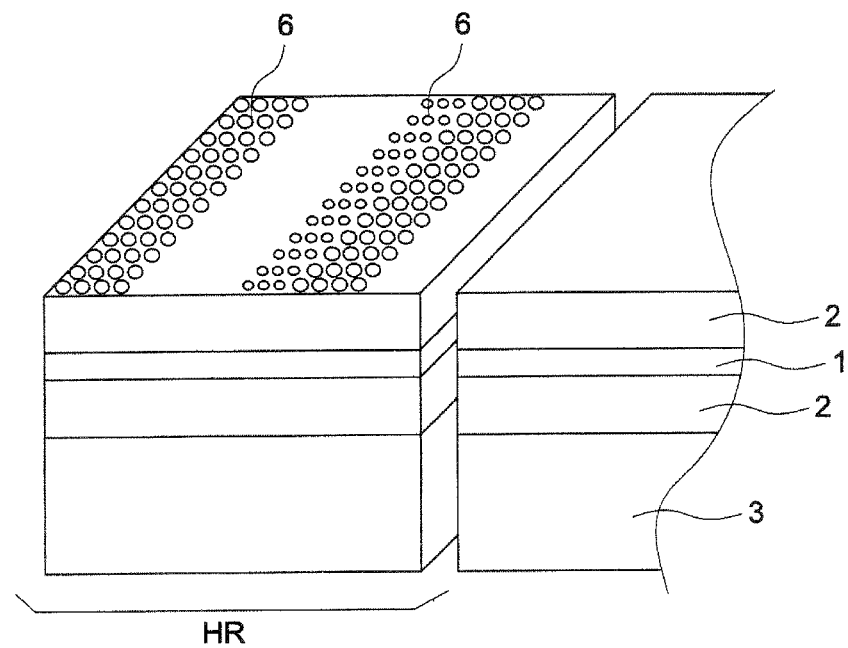
FIG. 4c: a diagram of a high-reflectivity structure obtained by the etching of various subwavelength structures in an edge, located at the end of an emissive cavity of a light-emitting device.

FIG. 4c shows moreover that it is possible to etch various subwavelength structures 6 in an edge located at the end of the emissive cavity, the distance from which may vary. By adjusting this distance between the structure HR and the emissive cavity it is possible to adapt the reflectivity of the structure HR. These subwavelength structures 6 may for example be cylindrical holes of various diameters.

An application example of interest is the case of a quantum cascade laser emitting at 9 μm in TM polarization (i.e. the electric field of the emission zone 1 of the laser is perpendicular to the plane of the multilayer stacks of the active zone 1 of the quantum cascade laser), consisting of strata having different refractive indices varying around the refractive index of InP. A structure AR comprising subwavelength structures makes it possible to obtain a reflectivity of less than 0.2% using current technological means. Likewise, a structure HR made up of two strata of the constituent material of the emissive cavity of the quantum cascade laser, each strata with a thickness e of 0.7 μm, separated by an air layer of 2.2 μm thickness, makes it possible to achieve a reflectivity of 95.4%. In the case of a structure made up of three emissive material layers separated by air layers, the reflectivity as claimed as obtained to 99.5%.

It has been seen that by etching subwavelength structures on the external faces of laser cavities, or of any light-emitting or light-amplifying device, it is possible for the reflectivity thereof to be precisely adjusted. The difficulty to be resolved is that of carrying out these antireflection or high-reflectivity treatments on cavities not exceeding a few millimeters in size.

Figure 5:
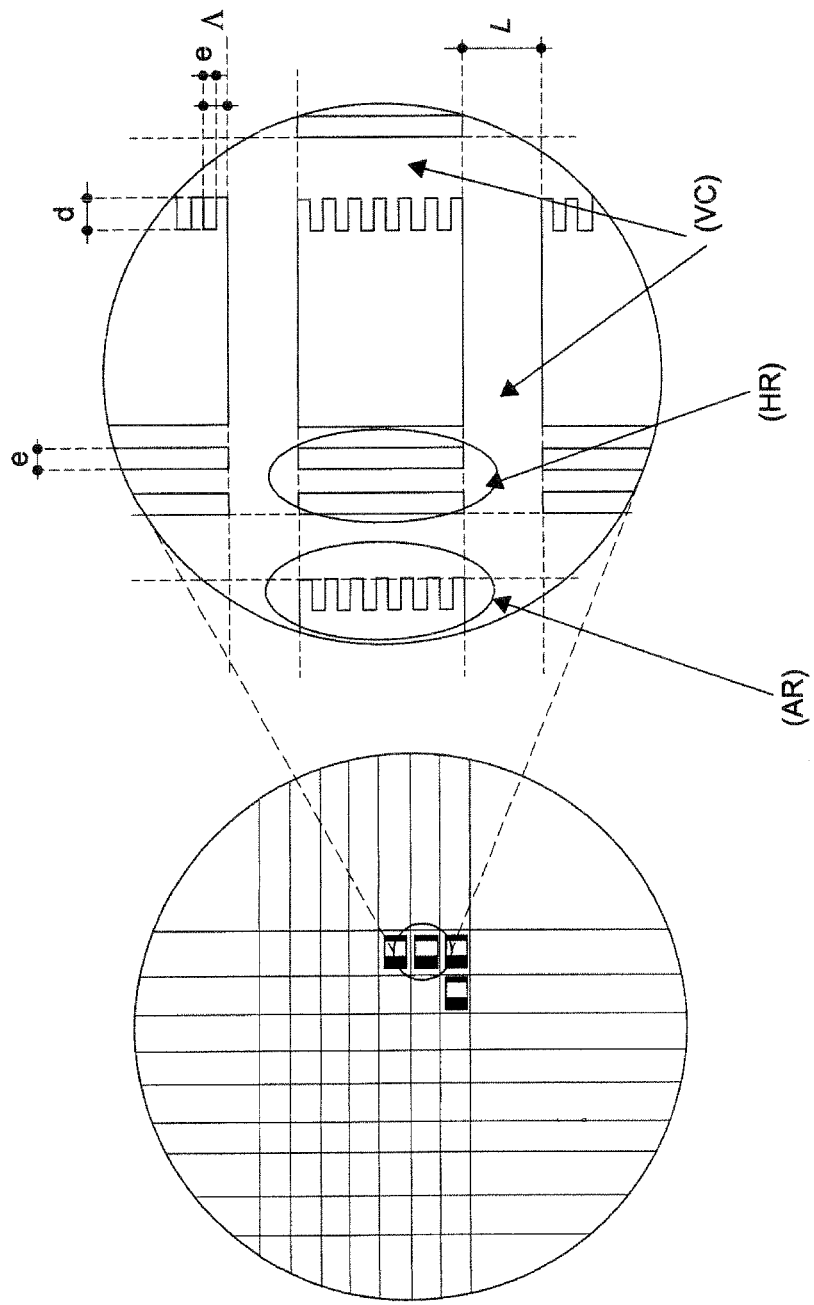
FIG. 5: a single mask for the wafer-scale fabrication of devices according to the invention.

FIG. 5 illustrates one possible way of producing light-emitting devices, and notably quantum cascade lasers, incorporating subwavelength structures, by using a simple process, which may be a wafer-scale process, and relying on the use of a single mask. The key elements determining the performance of the laser cavities produced using this process are the longitudinal and transverse dimensions of the structures AR and HR, namely d, a, Λ and e. In contrast, the performance does not depend on the etching depth h, for which the sole condition is that it must be equal to or greater than the height of the laser cavity. Under these conditions, FIG. 5 clearly shows that it is possible to etch, orthogonally to the plane on which the stack of epitaxially grown layers constituting the laser cavity is positioned, the antireflection AR and high-reflectivity HR functions and also cleavage lines VC, which will enable the wafer-scale-fabricated laser cavities to be separated, using a single mask. These cleavage lines VC are positioned immediately after the structures HR and AR.

In one specific application example produced with a quantum cascade laser emitting at 9 μm in TM polarization, the antireflection structure AR has a height d of about 1.3 μm, a width a of 0.5 μm and a period Λ of 2.9 μm. Moreover, these microstructures are etched over a depth h roughly equal to but greater than 9 μm. With these parameters, the element AR has a reflectivity of less than 0.2%. The structure HR is made up of two strata of constituent epitaxially grown materials of the laser cavity that are separated by an air layer, each stratum having an optical thickness of about 2.2 μm, the optical thickness being the thickness e multiplied by the refractive index of the stratum. The strata of epitaxially grown materials, consisting of materials having refractive indices varying around that of InP, i.e. about 3, therefore have a thickness of about 0.7 μm, whereas the intermediate air strata have a thickness of 2.2 μm, the refractive index of air being about 1. In this way, the element HR has a reflectivity of greater than 95%. The cleavage lines, for separating the laser cavities thus produced, are etched over a depth of roughly equal to but greater than 10 μm, the width L of these cleavage lines being about 100 μm.

The use of this single mask for etching the structures AR and HR, and also the cleavage lines, in a single step, including for the wafer-scale fabrication of laser cavities, constitutes an important advantage. In addition, the quality of the cavities produced, and notably their length, is perfectly controlled. This makes it possible to produce a large number of laser cavities of very uniform performance.

For deep etching of the microstructures as described above, it is possible to use an HPD (high plasma density) source and more particularly an ICP (inductively coupled plasma) system, i.e. enabling dry etching to be carried out in a plasma obtained by inductive coupling. This technique allows the energy and the flux density of the ions to be separately controlled over the specimen to be etched. Induction produces a plasma close to the substrate, while an independent capacitive source imposes the desired kinetic energy on the highly disassociated species. Unlike other plasma generation methods, the ICP method has the advantage of producing plasmas with a high ion density independently of the energy of the reactive ions. By independently biasing the source it is possible to accelerate the ions toward the substrate, thereby controlling the chemical and physical appearance of the etching and therefore controlling the etch rate, the anisotropy and the surface quality. The ICP system makes it possible for example to etch holes of submicron size over a depth of about 5 μm with good surface rendition in a GaAs substrate.

Moreover, by using an ICP system it is possible to produce deeply etched structures, the dimensions of which are of the order of one micron, without altering the geometry and the aspect ratio of these structures.

It is also possible to use the RIE (reactive ion etching) technology to produce the subwavelength structures and the cleavage lines using a single mask.

To summarize, the main advantage of the invention is that it enables optimized antireflection or high-reflectivity treatments to be carried out by the etching of subwavelength structures, resulting in artificial materials of perfectly controlled refractive index. Moreover, the process according to the present invention has the advantage of allowing wafer-scale fabrication, with current technological means, of light-emitting devices of improved and uniform performance.

The invention claimed is:

1. A process for fabricating light-emitting devices, each light-emitting device having an active zone in which a light beam having one or more wavelengths can propagate along a propagation direction, and a first wall comprising subwavelength structures smaller in size than the wavelength in a direction transverse to the propagation direction of the light beam enabling the reflectivity of the wall to be adjusted, the process comprising:
producing a single mask;
etching, through the single mask, in a substrate consisting of a stack of layers of semiconductor material forming an emissive cavity, the subwavelength structures and cleavage lines defining the light emitting device during the same etching operation; and
the first wall comprising the subwavelength structures and constituting an antireflection structure providing an antireflection function, comprising a reflectivity of less than about 10% with respect to the wavelength or wavelengths.

2. The process for fabricating light-emitting devices as claimed in claim 1, wherein:
the process is a wafer-scale process;
the cleavage lines separate the light-emitting devices from one another;
the light-emitting devices are produced using the single mask; and
each light-emitting device has a length imposed by the single mask.

3. The process for fabricating a light-emitting device as claimed in claim 2, wherein the etching is carried out in a substrate comprising a stack of layers of semiconductor materials forming an emissive cavity being based on the use of a high plasma density (HPD) source.

4. The process for fabricating a light-emitting device as claimed in claim 2, wherein the etching is carried out in a substrate comprising a stack of layers of semiconductor materials forming an emissive cavity being based on the use of a high plasma density (FWD) source.

5. The process for fabricating a light-emitting device as claimed in claim 2, wherein the etching is carried out in a substrate comprising a stack of layers of semiconductor materials forming an emissive cavity being based on the use of reactive ion etching (RIE) technology.

6. The process for fabricating light-emitting devices as claimed in claim 1, wherein the first wall constitutes an output face orthogonal to the light beam.

7. The process for fabricating light-emitting devices as claimed in claim 1, wherein the light-emitting device further comprises a second wall constituting a second antireflection structure opposite and parallel to the first antireflection structure, the combination of the two antireflection structures enabling the light emitting device to provide a semiconductor light amplifier function.

8. The process for fabricating a light-emitting device as claimed in claim 1, wherein the light-emitting device further comprises a second wall constituting a high-reflectivity structure having a reflectivity greater than about 90% with respect to the wavelength or wavelengths, the second wall being opposite and parallel to the wall constituting an antireflection structure.

9. The process for fabricating a light-emitting device as claimed in claim 8, wherein the first wall constitutes the antireflection structure and, opposite it, the second wall constitutes the high-reflectivity' structure and defines an amplifying cavity of a semiconductor laser.

10. The process for fabricating a :light-emitting device as claimed in claim 8, wherein the high-reflectivity structure comprises of an alternation of N strata having a high refractive index greater than or equal to about 3, and of (N−1) strata having a low refractive index equal to about 1, N being an integer equal to or greater than 1.

11. The process for fabricating a light-emitting device as claimed in claim 9, wherein the active zone is formed from an integer number of periods, each active zone comprising a stack of epitaxially grown layers of semiconductor material such as InGaAs, AlInAs, GaAs, AlGaAs and InP, and wherein the light emitting device is a quantum cascade laser (or QCL).

12. The process for fabricating a light-emitting device as claimed in claim 11, wherein the high-reflectivity structure comprises an alternation of N strata having a high refractive index greater than or equal to about 3 and of (N−1) strata having a low refractive index equal to about 1, N being an integer equal to or greater than 1.

13. The process for fabricating a light-emitting device as claimed in claim 12, wherein the high-reflectivity structure comprises an alternation of strata of materials having a high refractive index and air strata, and wherein all the strata has approximately equal optical thicknesses.

14. The process for fabricating a light-emitting device as claimed in claim 12, wherein the high-reflectivity structure comprises an alternation of strata comprising etched subwavelength periodical structures enabling the effective refractive index of each of the strata, and consequently that of the high-reflectivity structure, to be fixed.

15. The process for fabricating a light-emitting device as claimed in claim 12, wherein:
the light beam has a wavelength of 9 .mu·m;
each stratum of the high-reflectivity structure has an optical thickness of about 2.2 .mu·m; and
the antireflection structure has a period of about 2.9 .mu·m, a depth of about 1.3 .mu·m, a width of about 0.5 .mu·m and an etched height of greater than 9 .mu·m.

16. The process for fabricating a tight-emitting device as claimed in claim 14, wherein the etching is carried out in a substrate comprising a stack of layers of semiconductor materials forming an emissive cavity being based on the use of reactive ion etching (RIF) technology.

17. The process for fabricating a light-emitting device as claimed in claim 1, wherein the etching is carried out in a substrate comprising a stack of layers of semiconductor materials forming an emissive cavity being based on the use of a high plasma density (HPD) source.

18. The process for fabricating a light-emitting device as claimed in claim 17, wherein the high plasma density source is an inductively coupled plasma (ICP).

19. The process for fabricating a light-emitting device as claimed in claim 1, wherein the etching is carried out in a substrate comprising a stack of layers of semiconductor materials forming an emissive cavity being based on the use of reactive ion etching (RIE) technology.

* * * * *

UNITED STATES PATENT AND TRADEMARK OFFICE
CERTIFICATE OF CORRECTION

PATENT NO. : 8,685,771 B2  
APPLICATION NO. : 12/666068  
DATED : April 1, 2014  
INVENTOR(S) : Mane-Si Laure Lee-Bouhours et al.

Page 1 of 1

It is certified that error appears in the above-identified patent and that said Letters Patent is hereby corrected as shown below:

On the Title Page, Item (57) In the Abstract:

Line 2, delete "device" and insert -- devices --;
Line 3, delete "fabricating" and insert -- fabrication --;

In the Claims:

Claim 4, column 7, line 55, delete "(FWD)" and insert -- (HPD) --;
Claim 9, column 8, line 14, delete the """ after "high-reflectivity";
Claim 16, column 8, line 53, delete "tight-emitting" and insert -- light-emitting --; and
Claim 16, column 8, line 57, delete "(RIF)" and insert -- (RIE) --.

Signed and Sealed this
Twenty-fourth Day of June, 2014

Michelle K. Lee
*Deputy Director of the United States Patent and Trademark Office*